(12) United States Patent
Lappöhn

(10) Patent No.: US 7,690,931 B2
(45) Date of Patent: Apr. 6, 2010

(54) COMPONENT FOR CONNECTION TO A SECOND COMPONENT

(75) Inventor: Jürgen Lappöhn, Gammelshausen (DE)

(73) Assignee: ERNI Electronics GmbH, Adelberg (DE)

( * ) Notice: Subject to any disclaimer, the term of this patent is extended or adjusted under 35 U.S.C. 154(b) by 326 days.

(21) Appl. No.: 11/827,536

(22) Filed: Jul. 12, 2007

(65) Prior Publication Data
US 2008/0049404 A1 Feb. 28, 2008

(30) Foreign Application Priority Data
Aug. 25, 2006 (DE) ............ 10 2006 039 817

(51) Int. Cl.
*H01R 12/00* (2006.01)
(52) U.S. Cl. .................... 439/83; 228/254
(58) Field of Classification Search .......... 439/83, 439/875, 876; 228/254, 180.1, 180.21
See application file for complete search history.

(56) References Cited
U.S. PATENT DOCUMENTS

| 4,991,059 | A | | 2/1991 | Kiyose | |
|---|---|---|---|---|---|
| 5,411,236 | A | | 5/1995 | Morita et al. | |
| 6,054,653 | A | * | 4/2000 | Hansen et al. | 174/261 |
| 6,267,630 | B1 | * | 7/2001 | Machado | 439/876 |

| 2004/0140414 | A1 | 7/2004 | Chen |
|---|---|---|---|
| 2006/0037778 | A1 | 2/2006 | Birgel et al. |

FOREIGN PATENT DOCUMENTS

| DE | 35 36 494 A1 | 4/1987 |
|---|---|---|
| DE | 35 36 496 A1 | 4/1987 |
| DE | 101 04 414 A1 | 8/2002 |
| DE | 102 19 427 A1 | 11/2003 |
| DE | 10 2004 037 786 A1 | 3/2006 |
| DE | 20 2005 020 474 U1 | 3/2006 |

* cited by examiner

*Primary Examiner*—Khiem Nguyen
(74) *Attorney, Agent, or Firm*—Collard & Roe, P.C.

(57) ABSTRACT

The invention relates to a first component (12, 13, 31, 36a-36c, 50, 62) intended for being connected to a second component (14, 15, 51, 63a-63c). The first component (12, 13, 31, 36a-36c, 50, 62) comprises at least one recess (16, 17, 32, 37a-37c, 52a-52c, 64a-64c) having at least one opening (19, 20, 34, 35, 54a-54c) which will be filled at least in part by the second component (14, 15, 51, 63a-63c) which latter is in a flowing condition during establishment of the connection, at least in the area of the opening (19, 34, 54a-54c). A reduction in cross-section (18, 33, 38a-38c, 53a-53c, 65a-65c) is provided in the recess (16, 17, 32, 37a-37c, 52a-52c, 64a-64c) that will be back-filled by the second component (14, 15, 51, 63a-63c) during establishment of the connection. The reduction in cross-section (18, 33, 38a-38c, 53a-53c, 65a-65c) is provided in the recess (16, 17, 32, 37a-37c, 52a-52c, 64a-64c) on the side facing the second component (14, 15, 51, 63a-63c).

13 Claims, 5 Drawing Sheets

COMPONENT FOR CONNECTION TO A SECOND COMPONENT

CROSS REFERENCE TO RELATED APPLICATIONS

Applicant claims priority under 35 U.S.C. §119 of German Application No. 10 2006 039 817.3 filed Aug. 25, 2006.

PRIOR ART

The present invention relates to a component for connection to a second component according to the preamble of the independent claim.

A multi-pole multi-row plug-in connector with a screening, intended for being mounted on printed boards or the like, has been described in Utility Patent DE 20 2005 020 474 U1, where the mounting sections of the electric contact elements, which project from the connector housing and which are intended to establish contact with a printed board, and the contact section of the screening are arranged according to a predefined grid pattern and are prepared for being connected to the printed board by soldering. The screening elements comprise contact pins that are passed through holes in the printed board during assembly and are then fixed by soldering. The flat contact elements, having a rectangular conductor cross-section, are bent off at their rear ends facing the printed board by an angle of approximately 90 degrees in order to provide a sufficiently large contact area for being soldered to the printed conductors on the printed board.

DE 10 2004 037 786 A1 describes a printed board with SMD devices to be mounted, where at least one component comprises a connection wire that is pushed through a metallized connection bore in the printed board during assembly of the printed board. The printed board is provided for assembly of components on both sides. In order to ensure that the component to be mounted, provided with the connection wire, will not fall off the connection bore when the printed board is turned over it is provided to fill at least part of the connection bore with a conductive bonding agent prior to the mounting operation. After assembly of the SMD device the conductive bonding agent then encloses the connection wire of the SMD device over the full area of the connection bore, thereby fixing the connection wire in its position before it is soldered. The connection bore is made up from at least two bores that interact one with the other so that a portion of reduced cross-section is obtained in the connection bore in an overlapping area of the bores. That reduced cross-section is intended on the one hand to fix the connection wire of the SMD device in the bore prior to the soldering operation, while its main function is to assist in establishing the electric contact with the connection wire. The printed board can be described as the first component, intended to be connected with the conductive bonding agent, which latter can be described as the second component.

Patent Application DE 102 19 427 A1 describes a method for producing a mechanical and an electric connection between a printed board and a contact pin to be arranged on the printed board. The contact pin is hollow, on at least one of its ends, and provided with an external bead near the hollow end. In a first step, a paste solder is applied around a receiving passage opening provided in the printed board for the contact pin. Thereafter, the contact pin is positioned on the printed board so that the hollow end of the contact pin comes to extend into the receiving passage opening and to project beyond the other side of the printed board when its external bead abuts against the one side of the board. A conical expanding device is heated up for the purpose of expanding the hollow end of the contact pin. The hollow end of the contact pin is then expanded by means of the heated-up expanding device and is fused by the heat conducted from the expanding device through the contact pin to the external bead.

Patent Application DE 35 36 496 A1 describes a method of producing a milling cutter where a tool carrier is fitted with two cutting edges of the milling cutter. Production of the tool carrier by investment casting is carried out simultaneously with the permanent mechanical connection of the tool carrier. The cutting edges are provided with openings with enlargements in cross-section that are to be filled by the liquid metal of the tool carrier being produced. Once the molten material has solidified, the tool carrier so produced is already positively connected with the cutting edges.

Now, it is the object of the present invention to provide a first component, intended for being connected with a second component, which allows a mechanically stable connection to be achieved by extremely simple means and which, when provided, allows an electric connection with good electric properties to be obtained.

That object is achieved by the features defined in the independent claim.

DISCLOSURE OF THE INVENTION

The component according to the invention, intended for being connected to a second component, comprises at least one recess with at least one opening which will be filled at least in part by the second component which latter is in a flowing condition during establishment of the connection, at least in the area of the opening. The recess in the first component comprises a reduction in cross-section that will be back-filled by the second component during establishment of the connection. The reduction in cross-section is provided in the recess on the side facing the second component. The component according to the invention allows connection to be established with a second component that may have metallic properties or may be made from a plastic material. It is merely necessary that the second component be in flowing condition during establishment of the connection, at least in the region of the opening, so that the second component can penetrate into the recess in the first component and can back-fill the reduction in cross-section facing the second component.

The first component should be sufficiently thermostable, at least in the region of the opening, to ensure that the second component, which normally will have been heated up in the process of rendering the material flowable, cannot cause the first component to melt.

A mechanically stable connection between the first and the second components is achieved by the fact that due to the arrangement of the reduction in cross-section in the recess on the side facing the second component an increased lever arm is obtained that counteracts any tilting or torsional movements between the two components.

When the first component is an electric component that is to be fixed on a board by soldering, where the second component is preferably constituted by the soldering material, a substantial advantage results from the fact that the opening need not be filled up completely by the soldering material. This results in considerable cost advantages especially in series production.

Additional cost advantages result especially from the fact that no further measures are required to guarantee a durable connection between the first component and the second component. Especially, no components such as screws or clamps are needed.

Advantageous further developments and embodiments of a first component according to the invention are apparent from the dependent claims.

An advantageous feature provides that the at least one recess comprises at least one further opening provided for example on the side facing away from the second component. The further opening may act as pressure-relief and prevents air from being trapped.

The first component preferably consists of a connection element of an electric and/or electronic component. The electric and/or electronic component may especially be an SMD device (surface-mount device). Particular advantages are achieved when the first component is a plug-in connector. Using the feature provided according to the invention, an especially stable connection is achieved between the plug-in connector and the printed board, combined with low consumption of soldering material, the latter constituting the second component in that case. The first component may in this case consist of a contact element, a screening element or a connection element of the plug-in connector.

Further, the second component provided may especially be a plastic part that is to be positively connected with the first component. The plastic material, being liquid or at least in a flowing condition when the connection is made, at least in the area of the reduction in cross-section in the recess of the first component, penetrates into the recess at least in part, but preferably into the entire recess, thereby establishing an undetachable connection with the first component.

According to an advantageous embodiment, a plurality of recesses, each comprising one reduction in cross-section, may be provided in the first component. It is possible in this way to produce load-carrying connections between the two components.

A simple way of producing the recess with its reduction in cross-section consists of providing two bores with different bore diameters.

According to an alternative, the reduction in cross-section is formed using an expanding device. Suited as expanding device is a conical die, for example. The expanding device used for forming the reduction in cross-section may be used also in cases where the first component is made from metal.

According to a further alternative, the reduction in cross-section is produced by giving the recess a dovetail shape at least in the area of the reduction in cross-section. This permits the first component, including the recess with the reduction in cross-section, to be produced by a single operation.

Certain embodiments of the invention are illustrated in the drawing and will be described hereafter in more detail.

Figure 1:
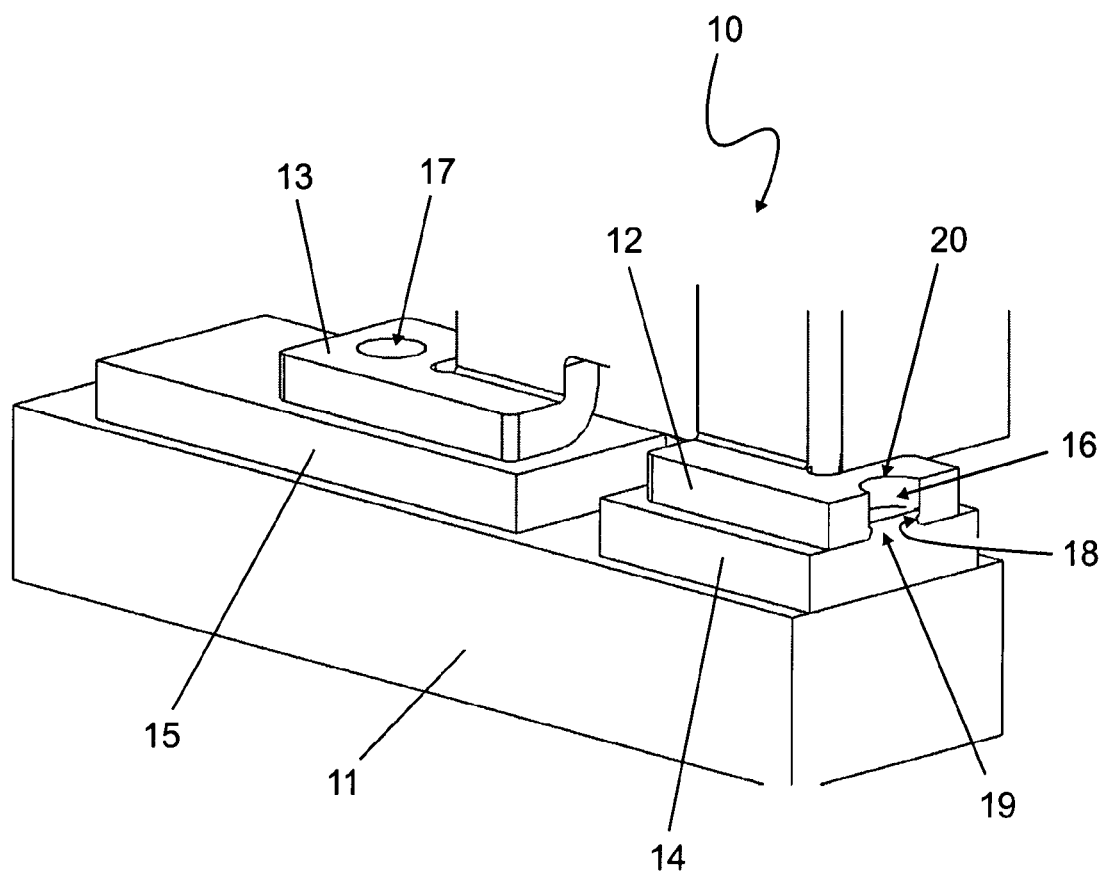
FIG. 1 shows a perspective view of a first component, in the form of an electric or electronic element, which is connected with a soldering material that serves as the second component.

FIG. 1 shows a perspective view of an electric or electronic component 10, suggested by a few lines, which is connected with a board 11 by soldering. The component 10 comprises a contact element 12 as well as a connection element 13, which constitute embodiments of a first component and which are soldered to the board by means of a soldering material 14, 15, being one embodiment of a second component. The first component 12, 13 is already positively connected with the second component 14, 15 in the illustrated embodiment.

The first component 12, 13 comprises at least one recess 16, 17 which contains, on the side facing the second component 14, 15, a reduction in cross-section 18 that defines a first opening 19.

Conveniently, the first component 12, 13 is designed at least as part of an SMD device, for example a plug-in connector, which is soldered to printed conductors (not shown in detail) on the surface of the board 11 using the soldering material 14, 15 as the second component.

For producing the connection, the second component 14, 15 (soldering material) is heated up until the second component 14, 15 is liquid or at least in flowing condition, at least in the area of the opening 19, in order to permit the second component 14, 15 to penetrate into the recess 16, 17 of the first component 12, 13 and to back-fill the reduction in cross-section 18.

As is indicated in FIG. 1, the recess 16 is filled up with the second component 14 only in part. For producing a stable connection, it is already sufficient to have the reduction in cross-section 18 back-filled; filling the recess 16, 17 of the first component 12, 13 up to a further degree will not increase the mechanical stability any further. This makes it possible to reduce the consumption of the second component 14, 15, being the soldering material in the present embodiment.

Each of the recesses 16, 17 of the first components 12, 13 comprises at least one further opening 20, arranged opposite the first opening 19, for example. The further opening 20 assists the second component 14, 15 in entering the recesses 16, 17 during establishment of the connection in that it enables the air to escape from the recesses 16, 17. If it is intended to completely fill up the recesses 16, 17 with the second component 14, 15 after establishment of the connection, the further opening 20 may prevent air from being trapped in the second component 14, after solidification.

Figure 2:
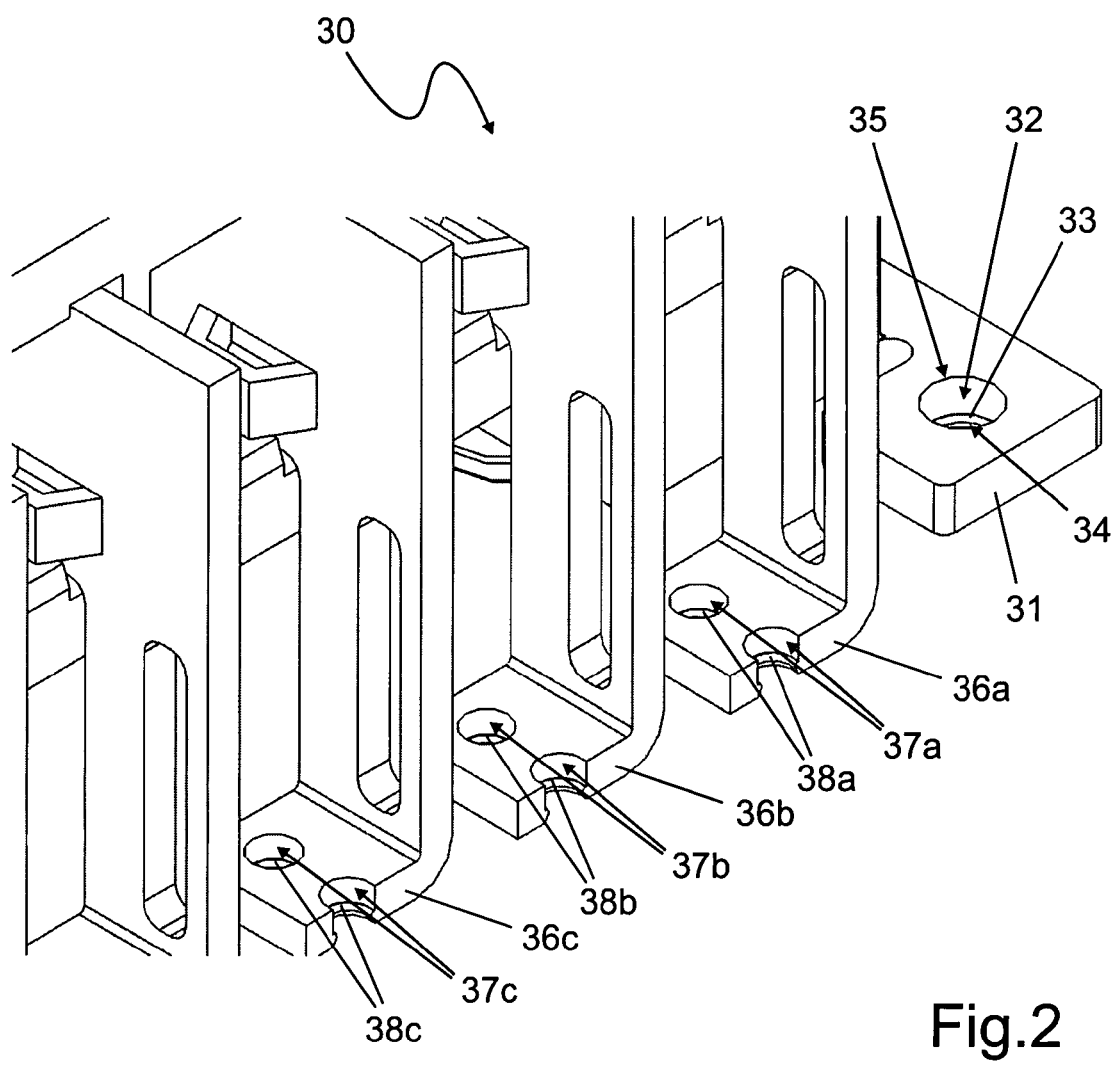
FIG. 2 shows a perspective view of contact elements of a plug-in connector that serve as the first component, prior to being connected with a soldering material as the second component.

FIG. 2 shows a perspective view of a connection area of a plug-in connector 30 intended for being connected to a board, not shown in detail, by soldering. The plug-in connector 30 contains a connection element 31 as one example of a first component, which may correspond to the connection element 31 illustrated in FIG. 1. The connection element 31 comprises a recess 32 which is provided, on its side facing the second component, with a reduction in cross-section 33 that is delimited by a first opening 34. In the embodiment shown, the recess 32 is again intended to have at least one further opening 35.

The plug-in connector 30 comprises a plurality of contact elements 36a, 36b, 36c, each provided with two recesses 37a, 37b, 37c. The contact elements 36a-36c are exemplary embodiments of first components which may comprise a plurality of recesses 37a-37c.

The contact elements 36a-36c corresponding to the first components, as well as the connection element 31 corresponding to the first component, are intended to be connected with a soldering material, not shown in detail, as the second component.

FIG. 2 shows the contact elements 36a-36c in the form of sectional views that permit the reductions in cross-section 38a, 38b, 38c, provided in the recesses 37a-37c on the side facing the second component (soldering material) to be seen more clearly.

Figure 3:
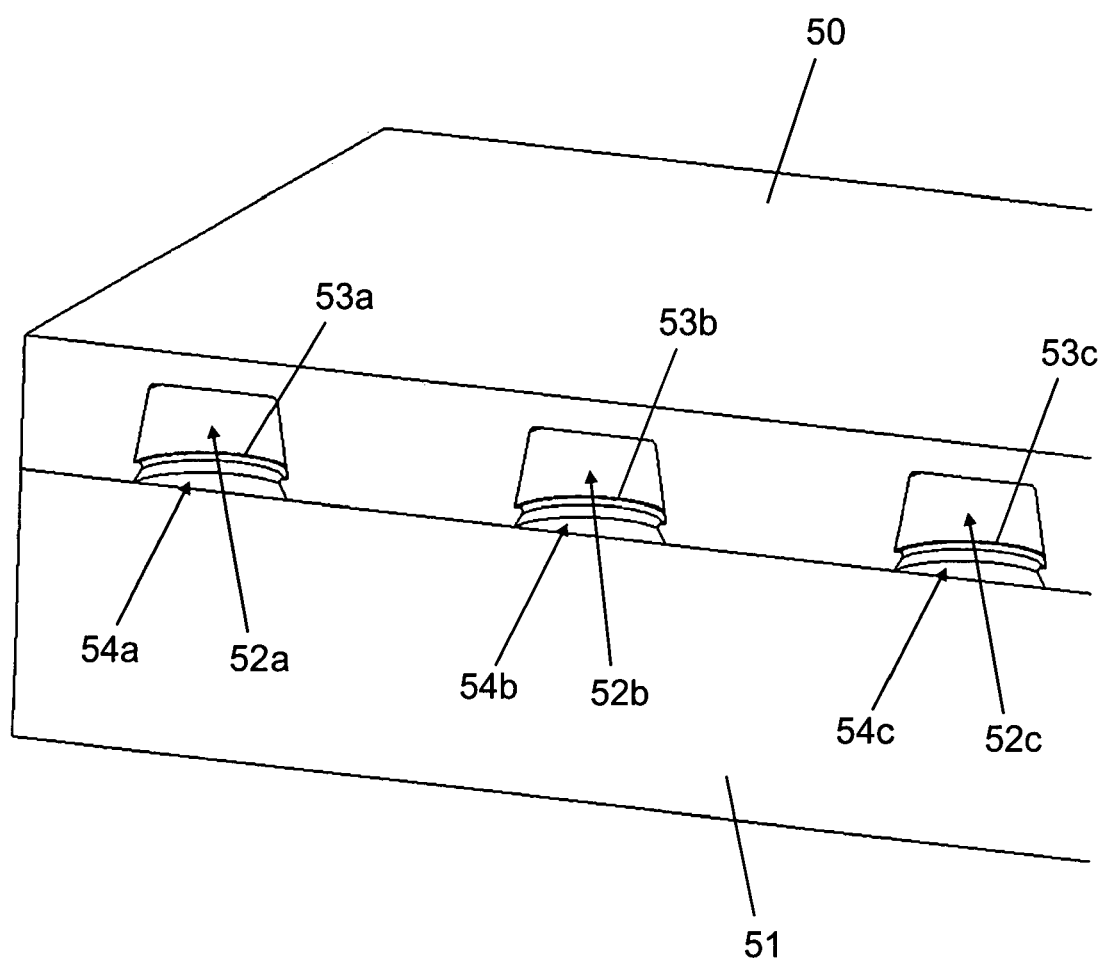
FIG. 3 shows a section through a second component in contact with the first component, prior to being connected with the first component.

FIG. 3 shows another embodiment of a first component 50 intended for being connected with a second component 51. The first component 50 may be a piece of metal, for example, while the second component 51 may be a plastic part, for example.

The first component 50 comprises at least one recess 52a, 52b, 52c with a component 53a, 53b, 53c provided on its end facing the second component 51. The at least one recess 52a-52c has a single opening 54a, 54b, 54c only in that embodiment.

Figure 4:
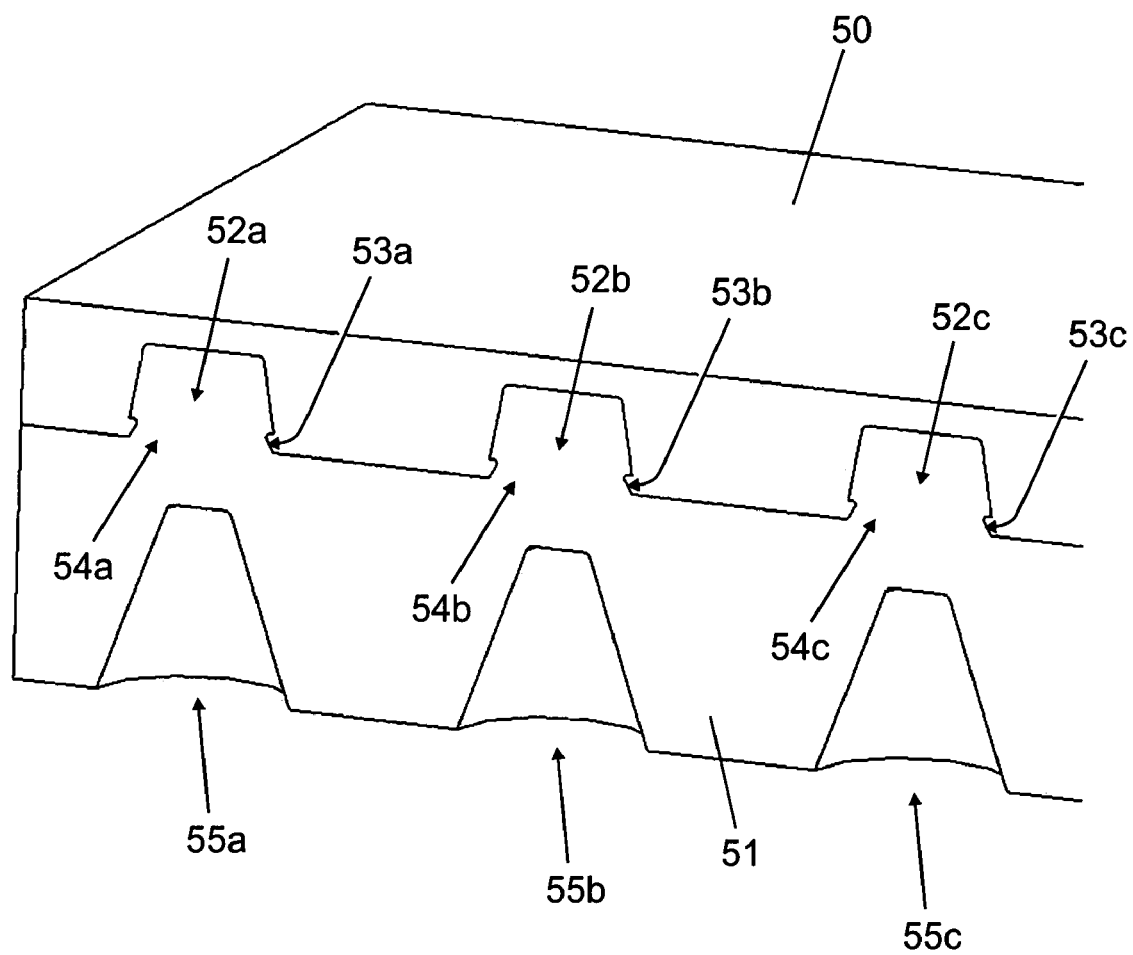
FIG. 4 shows a section through the arrangement illustrated in FIG. 3, after connection between the two components has been established.

FIG. 4 shows a cross-section through the arrangement illustrated in FIG. 3, after connection between the two components 50, 51 has been made. The second component 51 is rendered capable of flowing, for example by heating, at least to an extent to permit the second component 51 to enter the at least one recess 52a, 52b and to thereby back-fill the reduction in cross-section 53a-53c. In the illustrated embodiment, penetration of the second component 51 into the recess 52a-52c during establishment of the connection is assisted by a die, not shown in detail, which after production of the connection leaves its negative shape 55a-55c in the second component 51, for example.

Figure 5:
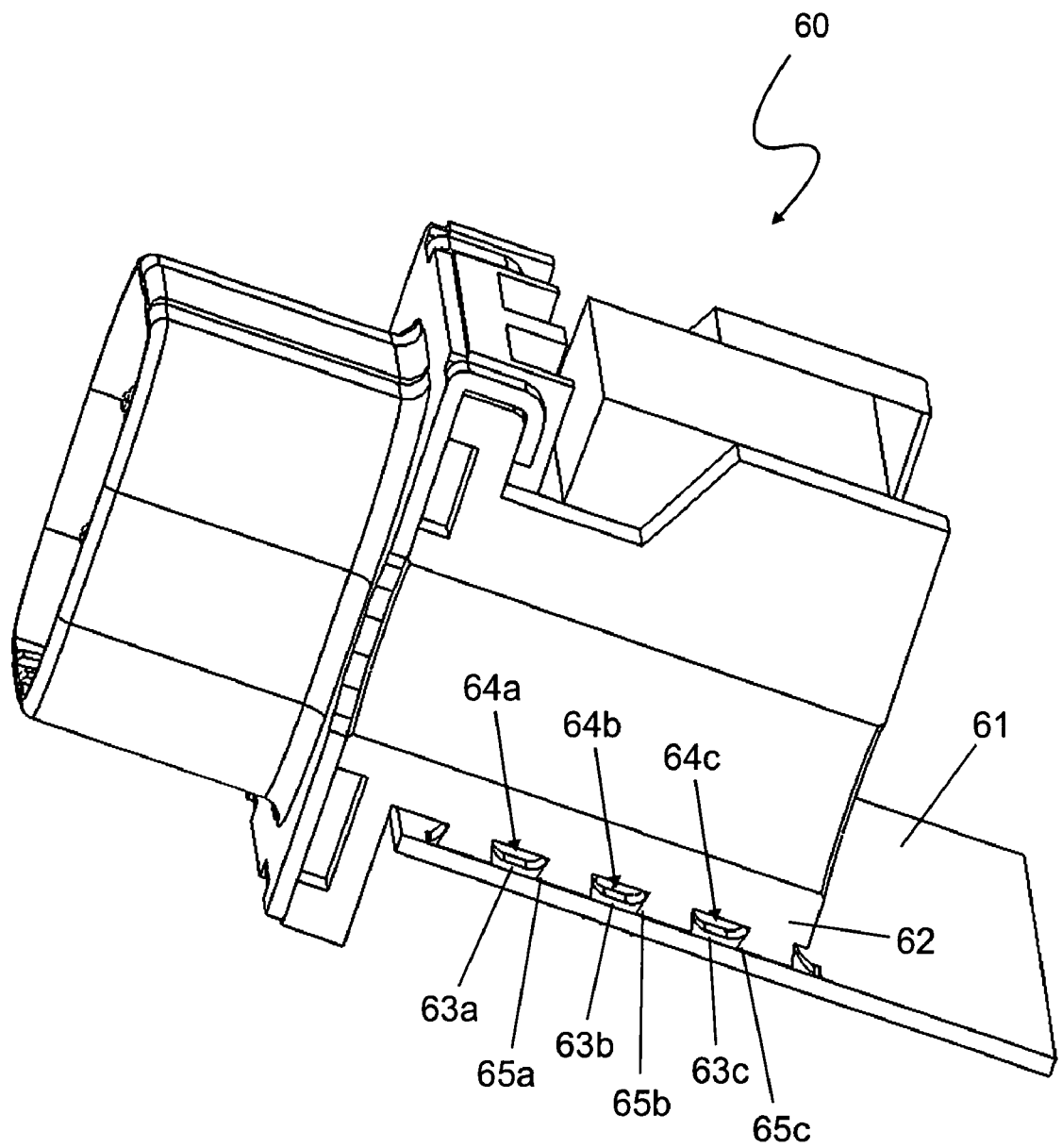
FIG. 5 shows a perspective view of a first component, realized as a plug-in connector, with recesses in dovetail shape.

FIG. 5 shows a perspective view of a plug-in connector 60 intended for being soldered to a board 61. The plug-in connector 60 comprises a connection element or screening element 62 as an exemplary embodiment of a first component, which is to be soldered to a printed conductor or an electric grounding surface, not shown in detail, on the board 61 using the soldering material 63a, 63b, 63 as an exemplary embodiment of the second component.

In the illustrated embodiment it is assumed that the at least one recess 64a, 64b, 64c provided in the first component 62 has a dovetail shape at least in part. The dovetail shape is implemented in the first component 62 in such a way that the reduction in cross-section 65a, 65b, 65c occurs on the side facing the second component 63a-63c (soldering material).

The embodiment shown in FIG. 5 illustrates the soldered condition where the second component 63a-63c (soldering material) has entered the at least one recess 64a-64c of the first component 62, at least in part, by back-filling the at least one reduction in cross-section 65a-65c.

The reductions in cross-section 18, 33, 38a-38c, 53a-53c, 65a-65c may be produced for example simultaneously with the production of the first component 12, 13, 31, 36a-36c, 50, 62. That embodiment is particularly well suited for first components 12, 13, 31, 36a-36c, 50, 62 that are produced by injection molding. The reductions in cross section 18, 33, 38a-38c, 53a-53c, 65a-65c may be formed on the first component 12, 13, 31, 36a-36c, 50, 62 using an expanding device. Particularly well suited for this purpose is a conical die that is pressed into the opening 19, 34, 54a-54c and is the rotated. The reductions in cross-section 18, 33, 38a-38c illustrated in FIGS. 1 and 2 may be realized especially by two bores of different bore diameters. Further, the reductions in cross-section 18, 33, 38a-38c, 53a-53c, 65a-65c may be obtained by milling of the recesses 16, 17, 32, 37a-37c, 52a-52c, 64a-64c.

The invention claimed is:

1. Component intended for being connected to a second component (14, 15, 51, 63a-63c), comprising at least one recess (16,17, 32, 37a-37c, 52a-52c, 64a-64c) with at least one opening (19, 20, 34, 35, 54a-54c) which will be filled at least in part by the second component (14,15, 51, 63a-6sc) which latter is in a flowing condition during establishment of the connection, at least in the area of the opening (19, 20, 34, 35, 54a-54c), comprising a reduction in cross-section (18, 33, 38a-38c, 53a-53c, 65a-65c) in the recess (16,17, 32, 37a-37c, 52a-52c, 64a-64c) that will be back-filled by the second component (14, 15, 51, 63a-63c) during establishment of the connection, wherein the reduction in cross-section (18, 33, 38a-38c, 53a-53c, 65a-65c) is provided in the recess (16,17, 32, 37a-37c, 52a-52c, 64a-64c) on the side facing the second component (14,15,51, 63a-63c).

2. The component as defined in claim 1, wherein the recess (16,17, 32, 37a-37c, 52a-52c, 64a-64c) comprises at least one further opening (20, 35).

3. The component as defined in claim 1, wherein the first component (12, 13, 31, 36a-36c, 50, 62) is part of an electric or an electronic component (10, 30).

4. The component as defined in claim 3, wherein the first component (12,13,31, 36a-36c, 50, 62) is an SMD device or at least part of an SMD device.

5. The component as defined in claim 4, wherein the first component (12, 13, 31, 36a-36c, 62) is part of a plug-in connector (30, 60).

6. The component as defined in claim 5, wherein the first component (12, 13, 31, 36a-36c, 62) is a contact element of the plug-in connector (30, 60).

7. The component as defined in claim 1, wherein the second component (14,15, 51, 63a-63c) is a soldering material.

8. The component as defined in claim 1, wherein the second component (14,15, 51, 63a-63c) is a plastic part.

9. The component as defined in claim 1, wherein a plurality of recesses (16,17, 32, 37a-37c, 52a-52c, 64a-64c) with reductions in cross-section (18, 33, 38a-38c, 53a-53c, 65a-65c) are provided in the first component (12, 13, 31, 36a-36c, 50, 62).

10. The component as defined in claim 1, wherein the recess (16, 17, 32, 37a-37c, 52a-52c, 64a-64c) is a bore and that the reduction in cross-section (18, 33, 38a-38c, 53a-53c, 65a-65c) is formed by two different bore diameters.

11. The component as defined in claim 1, wherein the recess (16, 17, 32, 37a-37c, 52a-52c, 64a-64c) has a dovetail shape at least in the area of the reduction in cross-section (18, 33, 38a-38c, 53a-53c, 65a-65c).

12. The component as defined in claim 1, wherein the reduction in cross-section (18, 33, 38a-38c, 53a-53c, 65a-65c) is made using an expanding device.

13. The component as defined in claim 12, wherein the reduction in cross-section (18, 33, 38a-38c, 53a-53c, 65a-65c) is made using a conical die.

* * * * *